US006888414B2

(12) United States Patent
Albean

(10) Patent No.: US 6,888,414 B2
(45) Date of Patent: May 3, 2005

(54) CONTROLLABLE AND TESTABLE OSCILLATOR APPARATUS FOR AN INTEGRATED CIRCUIT

(75) Inventor: David Lawrence Albean, Indianapolis, IN (US)

(73) Assignee: Thomson Licensing S.A., Boulogne-Billancourt (FR)

( * ) Notice: Subject to any disclaimer, the term of this patent is extended or adjusted under 35 U.S.C. 154(b) by 0 days.

(21) Appl. No.: 10/239,110

(22) PCT Filed: Mar. 8, 2001

(86) PCT No.: PCT/US01/07455

§ 371 (c)(1), (2), (4) Date: Sep. 19, 2002

(87) PCT Pub. No.: WO01/73457

PCT Pub. Date: Oct. 4, 2001

(65) Prior Publication Data

US 2003/0048142 A1 Mar. 13, 2003

Related U.S. Application Data

(60) Provisional application No. 60/191,798, filed on Mar. 24, 2000.

(51) Int. Cl.[7] .......... H03B 27/00

(52) U.S. Cl. .......... 331/57; 331/108 C; 331/74; 331/34

(58) Field of Search .......... 331/57, 74, 108 C, 331/34, 1 A

(56) References Cited

U.S. PATENT DOCUMENTS

| | | | | |
|---|---|---|---|---|
| 4,517,532 | A | 5/1985 | Neidorff | 331/57 |
| 5,126,691 | A | 6/1992 | Mijuskovic et al. | 331/1 A |
| 5,355,097 | A | * 10/1994 | Scott et al. | 331/1 A |
| 5,517,109 | A | 5/1996 | Albean et al. | 324/158.1 |
| 5,737,342 | A | 4/1998 | Ziperovich | 714/736 |
| 5,815,043 | A | 9/1998 | Chow et al. | 331/57 |
| 6,380,782 | B2 | 4/2002 | Buck | |
| 6,397,342 | B1 | 5/2002 | Terauchi | |

FOREIGN PATENT DOCUMENTS

| | | | |
|---|---|---|---|
| DE | 19905499 | 8/1999 | G06F/1/04 |
| DE | 19830571 | 1/2000 | G06F/1/04 |

* cited by examiner

*Primary Examiner*—Arnold Kinkead
(74) *Attorney, Agent, or Firm*—Joseph S. Tripoli; Joseph L. Laks; Robert D. Shedd

(57) ABSTRACT

An integrated circuit (IC) includes an internal clock generator apparatus that provides various modes of operation of the integrated circuit. The internal clock generator apparatus includes a clock generator portion that is operable to provide a clock signal for various circuitry/logic of the integrated circuit and a control portion that is operable to receive a control signal to cause the integrated circuit to operate in one of several modes. In particular, the clock generator apparatus is responsive to the control signal, preferably from an external source, to bypass the clock signal, introduce a test clock signal for digital testing, and isolate and/or measure a delay through the clock generator portion of the clock generator apparatus.

20 Claims, 3 Drawing Sheets

RING OSCILLATOR
DATA_OUT
SCAN_MODE
RESETN
SCAN_ENABLE
Delay Logic
÷4
IC_CLK
Port_A5
Port_A5_Internal
15
16
17
18
19
20
30
31
32
34
36
38
40
42
44
48

50

| INPUTS | | | OUTPUTS | | Function / Comments |
|---|---|---|---|---|---|
| SCAN_ENABLE | SCAN_MODE | RESETN | IC_CLK | PORT_A5 | |
| 0 | 0 | 0 | $F_{ring}$ | Normal Output (PORT_A5_INTERNAL) | High F clock (not divided) to IC during reset |
| 0 | 0 | 1 | $F_{ring}/4$ | Normal Output (PORT_A5_INTERNAL) | Normal operation |
| 0 | 1 | 0 | DATA_OUT | Normal Output (PORT_A5_INTERNAL) | Reset during scan test mode |
| 0 | 1 | 1 | DATA_OUT | Normal Output (PORT_A5_INTERNAL) | Scan test mode |
| 1 | 0 | 0 | $F_{ring}$ | $F_{ring}$ | Observe and characterize ring oscillator |
| 1 | 0 | 1 | $F_{ring}/4$ | $F_{ring}/4$ | Observe and characterize ring oscillator |
| 1 | 1 | 0 | DATA_OUT | DATA_OUT delayed (through DELAY LOGIC) | Measure DELAY LOGIC delay |
| 1 | 1 | 1 | DATA_OUT | DATA_OUT delayed | Measure DELAY LOGIC delay |

FIG. 3

CONTROLLABLE AND TESTABLE OSCILLATOR APPARATUS FOR AN INTEGRATED CIRCUIT

This application claims the benefit under 35 U.S.C. §365 of International Application PCT/US01/07455, filed Mar. 8, 2001, which was published in accordance with PCT Article 21(2) on Oct. 4, 2001 in English; and which claims benefit of U.S. provisional application Ser. No. 60/191,798 filed Mar. 24, 2000.

FIELD OF THE INVENTION

The present invention relates to integrated circuits and, more particularly, to an internal clock generating apparatus in an integrated circuit.

BACKGROUND OF THE INVENTION

Integrated circuits (ICs) are extensively, if not exclusively, used in most electronic devices of today. Such ICs may be digital, analog, or a combination of digital/analog technology. In all types of ICs, it is necessary to provide on-chip clock circuitry to generate and/or provide an on-chip clock.

Ring oscillators are commonly used to generate on-chip clocks in digital ICs. Ring oscillators are particularly attractive for such usage because they are fully self-contained in the IC and do not require the use of any Input/Output (I/O) pins of the IC. It is beneficial for various reasons to limit the number of I/O pins on an IC.

It is critical to perform production testing of the various functions and/or characteristics of an IC including a ring oscillator. However, in order to perform production testing of an IC that contains a ring oscillator, it is desirable to provide a means of bypassing the ring oscillator and introducing a test clock in its place. For example, a test procedure for testing digital ICs usually includes timing tests, such as tests to determine setup and hold time data. These tests typically require control of the test clock and thus cannot simply use the free-running ring oscillator.

In addition, since a ring oscillator is basically an analog circuit, it is desirable to provide a means to test the ring oscillator via I/O pins of the IC. In particular, the delay through the ring oscillator determines its frequency, and thus it is desirable to characterize this delay over process, temperature, and voltage.

Thus, it is desirable to provide an IC with a ring oscillator that can be bypassed.

It is also desirable to provide an IC with a ring oscillator that will allow the introduction of a test clock for digital testing.

It is further desirable to provide an IC with a ring oscillator in which the delay through the ring oscillator may be isolated and/or measured.

SUMMARY OF THE INVENTION

The present invention is a clock generator apparatus for an integrated circuit that is functional in various modes of operation. Such modes of operation include generating a clock signal for clocking internal circuitry/logic of the integrated circuit, bypassing the clock generator and/or only a portion of the clock generator, introducing a test clock for digital testing, and/or isolating and measuring a delay time through the clock generator.

In a general form, the clock generator apparatus includes an oscillator and associated control circuitry/logic. The oscillator and associated control circuitry/logic are in communication with and utilize only existing input/output pins of the integrated circuit. The control circuitry/logic is operable to receive control signals via the input/output pins to provide the various modes of operation via the input/output pins.

The existing input/output pins are pins that are normally functional pins of the integrated circuit. The present invention utilizes these pins to enable the various test modes. The multiplexing of the selective input/output pins allows the integrated circuit to operate in a normal mode, but enables test modes when it is desired to test the integrated circuit. Sharing the function of these pins eliminates the need for adding test pins on the integrated circuit.

In a particular form, the clock generator apparatus is a ring oscillator and the control circuitry/logic includes multiplexers operable to receive the control signals from the input/output pins. The ring oscillator is formed by a delay line having a net inversion around a feedback loop to provide any frequency of clock signal. The delay line may be formed by a plurality of digital buffers. In order to provide net inversion, the ring oscillator is formed by either an odd number of inverters, or an even number of non-inverting buffers and an inverter. The frequency of the clock signal from the plurality of digital buffers may be reduced by appropriate divider circuitry/logic.

BRIEF DESCRIPTION OF THE DRAWINGS

Reference to the following description of the present invention should be taken in conjunction with the accompanying drawings, wherein:

FIG. 3 is a Table showing the various functionality of the exemplary embodiment of the ring oscillator and accompanying IC circuitry/logic of FIG. 2 under the control conditions also presented in the Table.

Corresponding reference characters indicate corresponding parts throughout the several views.

DETAILED DESCRIPTION OF THE INVENTION

Figure 1:
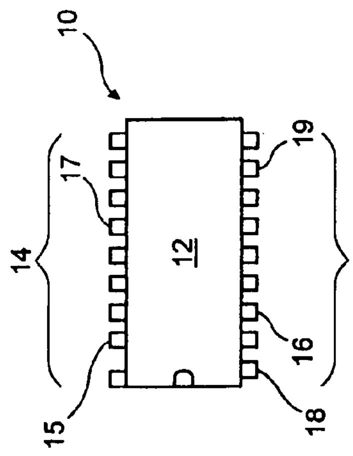
FIG. 1 is a representation of an integrated circuit in which the present invention may be utilized.

With reference to FIG. 1, there is depicted an integrated circuit (IC) generally designated 10 in which the present invention may be used. The IC 10 includes a case 12 that may contain analog, digital, and/or analog/digital logic/circuitry. The IC 10 includes a plurality of Input/Output (I/O) pins each one of which is generally designated 14. The number of I/O pins 14 will vary per the type and/or function of the IC. However, in accordance with an aspect of the present invention, the number of I/O pins 14 of the IC 10 does not change with the addition of the present invention.

Each one of the I/O pins 14 has a specific purpose/function dictated by the particular type and/or design of the IC. It should be appreciated that the particular type of IC is not material to the application and/or implementation of the principles of the present invention. Given this premise, however, several of the I/O pins 14 will be arbitrarily designated to comport with at least FIG. 2 and the discussion relating thereto. Therefore, it should be additionally appreciated that the below designation of specific I/O pins of the general I/O pins 14 are completely arbitrary. As well, the name of each designated I/O pin is arbitrary.

I/O pin 15 of the general I/O pins 14 is thus arbitrarily designated a DATA_OUT I/O pin. I/O pin 16 of the general I/O pins 14 is thus arbitrarily designated a SCAN_MODE I/O pin. I/O pin 17 of the general I/O pins 14 is thus arbitrarily designated a RESETN I/O pin. I/O pin 18 of the general I/O pins 14 is thus arbitrarily designated a SCAN_ENABLE I/O pin. I/O pin 19 of the general I/O pins 14 is thus arbitrarily designated a Port_A5 I/O pin.

Figure 2:
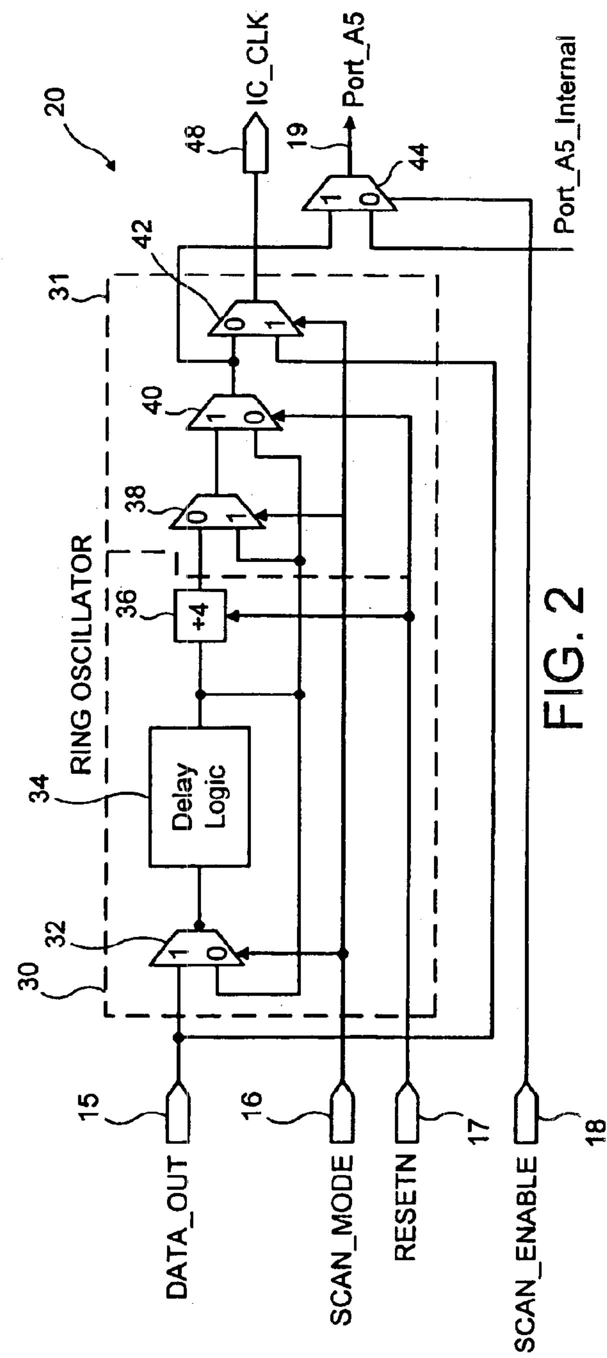
FIG. 2 is a schematic diagram of an exemplary embodiment of a ring oscillator and accompanying IC circuitry/logic in accordance with the principles of the present invention.

Referring now to FIG. 2, there is shown a schematic or circuit/logic diagram/layout of a portion of circuitry/logic, generally designated 20, within the IC 10. In accordance with an aspect of the present invention, there is provided an oscillator or oscillator circuitry/logic, generally designated 30, within or as part of the portion of circuitry/logic 20. In a preferred form the oscillator 30 comprises a ring oscillator and hereinafter, will be referred to as a ring oscillator. It should be appreciated, however, that the oscillator 30 may constitute another type of oscillator that functions/performs in the manner set forth herein. In addition, there is provided control circuitry/logic, generally designated 31, that may or may not form a part of the ring oscillator 30 proper, that is responsive to control signals to provide various modes of operation thereof as described herein either in conjunction with or not in conjunction with other circuitry/logic of the circuitry/logic 20 as herein described. Hereinafter, the term ring oscillator 30 will be assumed to include the control circuitry/logic 31 therein unless specifically indicated otherwise.

The ring oscillator 30 is coupled to or in communication with several I/O pins 14. In particular, the ring oscillator 30 is coupled to the DATA_OUT I/O pin 15, the SCAN_MODE I/O pin 16, the RESETN I/O pin 17, the SCAN_ENABLE I/O pin 18, and the Port_A5 I/O pin 19. The line labeled Port_A5_Internal is the Port_A5 of the integrated circuit 10 without the addition of the present invention. Thus, when the multiplexer 44 receives a logic "0" or low, the Port_A5_Internal signal is provided to the Port_A5 I/O pin 19 as it would without the addition of the present invention. When the multiplexer 44 receives a logic "1" or high, the output signal from the multiplexer 40 is provided as the signal to the Port_A5 I/O pin 19.

The output of the ring oscillator 30 is a clock signal which, in response to a control signal or control signals, may be provided to the IC_CLK output 48, may be bypassed completely, and/or may be provided as an output of the IC 10 on Port_A5 I/O pin 19. For example, I/O pins provided for implementing a test mode function of the IC 10 (such as "SCAN_ENABLE" and "SCAN_MODE" I/O pins 18 and 16 respectively used to perform a digital scan test) may be used to provide control signals to control a series of multiplexers (MUXs) as explained further below. The IC_CLK output 48 is an output of the oscillator arrangement shown in FIG. 2 that produces a signal that is coupled to circuitry internal to IC 10. That is, IC_CLK output 48 is an output that is in communication with further IC circuitry/logic (not shown) to provide the clock signal generated by the ring oscillator 30 to the further IC circuitry/logic internal to the IC 10. Thus, the IC_CLK signal is used to clock digital logic/circuitry (not shown) internal to the IC 10.

The ring oscillator 30 includes delay logic 34 that preferably comprises a plurality of digital buffers or inverters (hereinafter, inclusively "digital buffers"). In FIG. 2, the delay logic 34 includes an even number of digital buffers to provide a net inversion. The output of the delay logic 34 is provided as one input (here arbitrarily the "0" input) of a multiplexer 32 that has an inverted output (hence the "dot" or "circle" designation at its output). Alternatively, the delay logic 34 may be provided with an odd number of inverters in which case the output of the multiplexer 32 would not be inverted. In either case, when a control signal from the SCAN_MODE I/O pin 16 provides a logic "0" or low to the multiplexer 32, a closed loop is formed. The resulting circuit will oscillate at a frequency of approximately ½*td, where td is the total delay time around the closed loop. In an exemplary embodiment described herein, td equals n times the typical propagation delay of one of the digital buffers or inverters where n is the number of digital buffers or inverters in the loop (200 digital buffers or inverters in the exemplary embodiment). When the multiplexer 32 receives a control signal from the SCAN_MODE I/O pin that provides a logic "1" or high, the multiplexer 32 provides the signal that is on the DATA_OUT I/O pin 15 to the delay logic 34 such that an open loop is formed. When an open loop is formed, there is no oscillator functionality. Various modes are achieved when the multiplexer 32 receives a logic "1" from the SCAN_MODE I/O pin 16, some of which are provided in the Table 50 of FIG. 3.

The output signal from the delay logic 34 is also provided to an input of divider circuitry/logic 36. The divider 36 is operable during receipt of a logic "1" or high signal from the RESETN I/O pin 17, while a logic "0" or low signal from the RESETN I/O pin 17 resets the divider 36. Continued receipt of a logic "0" or low signal from the RESETN I/O pin 17 disables the divider 36 until a logic "1" or high signal is received. The divider 36 divides down or lowers the frequency of the ring oscillator ($F_{ring}$) by a value determined by the circuitry/logic of the divider 36. By providing a divider 36, the silicon area of the integrated circuit occupied by the digital buffers of the delay logic 34 is minimized or reduced, because a higher frequency reduces the number of digital buffers needed to implement the delay circuitry/logic 34). Thus, the ring oscillator 30 operates at a higher frequency than a desired frequency for the operation of the internal circuitry/logic of the integrated circuit that is then divided down by the divider 36 to produce a clock signal at a system clock rate (desired frequency of operation of the integrated circuit).

In the exemplary embodiment, the number of buffers included in the ring oscillator 30 is chosen to achieve a nominal frequency of 40 MHz ($F_{ring}$). The output of the ring oscillator 30 is provided to the divider 36 that divides the $F_{ring}$ by four (4) resulting in a 10 MHz output signal ($F_{ring}/4$) that is provided to the multiplexer 38 at one input (the "0" input) thereof.

Another input (the "1" input) of the multiplexer 38 receives the undivided signal ($F_{ring}$) from the delay logic 34. Selection of the output of the multiplexer 38 is under control of the signal from the SCAN_MODE I/O pin 16. A logic "1" or high signal on or from the SCAN_MODE I/O pin 17 selects the "1" input of the multiplexer 38 or the undivided signal ($F_{ring}$) from the delay logic 34. A logic "0" or low signal on or from the SCAN_MODE I/O pin 17 selects the "0" input of the multiplexer 38 or the divided signal ($F_{ring}/4$) from the delay logic 34.

The output of the multiplexer 38 as selected by the SCAN_MODE signal is provided to one input (the "1" input) of a multiplexer 40. Another input (the "0" input) of the multiplexer 40 receives the undivided signal ($F_{ring}$) from the delay logic 34. Selection of the output of the multiplexer 40 is under control of the signal from the RESETN I/O pin 17. A logic "1" or high signal on or from the RESETN I/O pin 17 provides the output signal from the multiplexer 38 as the output signal of the multiplexer 40, while a logic "0" or low signal on or from the RESETN I/O pin 17 provides the output signal from the delay logic 34 (i.e. the undivided frequency signal $F_{ring}$) as the output signal of the multiplexer 40.

The output of the multiplexer 40 as selected by the RESETN signal is provided to one input (the "0" input) of a multiplexer 42 and to the "1" input of the multiplexer 44 as indicated above. Another input (the "0" input) of the multiplexer 42 receives the signal on or from the DATA_OUT I/O pin 15. Selection of the output of the multiplexer 42 is under control of the signal from the SCAN_MODE I/O pin 16. A logic "1" or high signal on or from the SCAN_MODE I/O pin 16 provides the DATA_OUT signal as the output of the multiplexer 42, while a logic "0" or low signal on or from the SCAN_MODE I/O pin 16 provides the output of the multiplexer 40 as the output of the multiplexer 42. The output of the multiplexer 40 is provided to the IC_CLK line 48 as an internal signal. The internal signal on the IC_CLK line 48 is provided to the various internal circuitry/logic of the IC 10. Depending on the internal signal, various modes of operation may be maintained. These various modes of operation may be in conjunction with signals on, from, and/or to the various inputs and/or outputs of the integrated circuit 10 as herein described.

It should be recognized that the inputs ("1" and "0") to the various multiplexers may be reversed in which case the various input signals as indicated in the truth table portion of the Table 50 of FIG. 3 would be modified accordingly to provide the function and/or signals to the Outputs as indicated.

Referring to FIG. 3, there is shown a Table, generally designated 50, for the various multiplexers shown in FIG. 2 to implement the functions described herein and in the Table 50 under the control conditions defined by the truth table included therein and, in particular for the Inputs SCAN_ENABLE, SCAN_MODE, and RESETN. The Table 50 also shows the Outputs IC_CLK and PORT_A5, and the Function(Mode)/Comments.

In FIG. 2 and the Table 50 of FIG. 3, SCAN_ENABLE, SCAN_MODE, RESETN, and DATA_OUT are signals associated with input and/or output (I/O) pins of the IC 10. These signals are logically combined by the operation of the various multiplexers shown in FIG. 2 to generate the various mode functions listed in the Table 50. IC_CLK is a clock signal generated by the arrangement shown in FIG. 2 that is used to clock digital logic internal to the IC 10. Port_A5 is an output signal from the IC 10 that is generated by the multiplexer 44 to provide, as shown in the Table 50, either observation of the ring oscillator operation during a test mode of operation of the IC 10, or a normal output of the IC 10 during a normal mode of operation of the IC 10.

Figure 4:
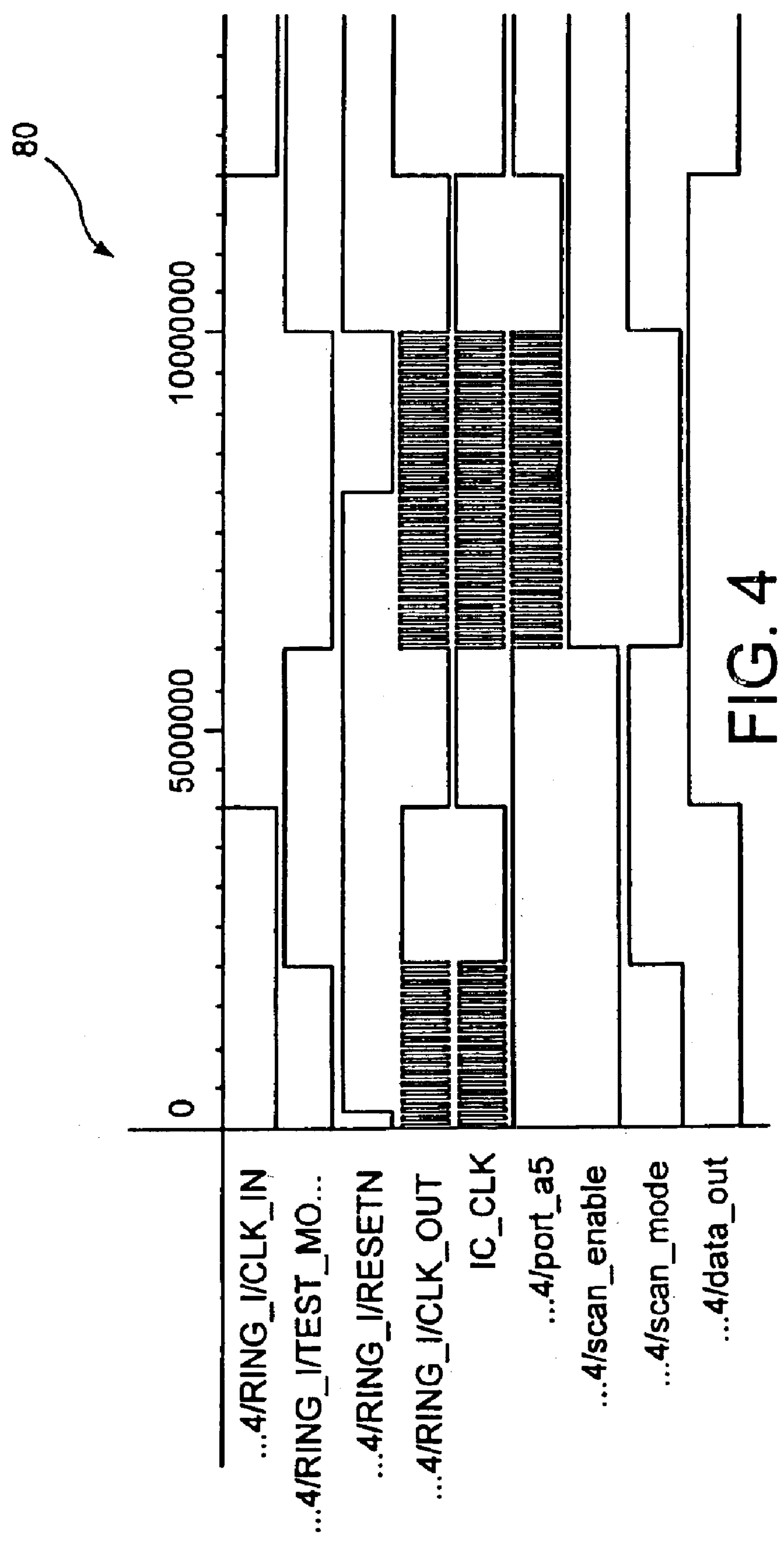
FIG. 4 is a timing diagram for the exemplary embodiment of the ring oscillator and accompanying IC circuitry/logic of FIG. 2.

Referring to FIG. 4, there is shown an exemplary timing chart, generally designated 80, illustrating the operation of the various features/functions shown in FIG. 2, listed in the Table 50 of FIG. 3, and described herein in conjunction therewith. It also represents a simulation display of the various test modes described in the Table 50.

While this invention has been described as having a preferred design and/or configuration, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. An integrated circuit comprising:

an oscillator operable to generate a first clock signal comprising a delay logic providing a net inversion delay output signal and a divider in communication with the delay logic and operable to receive the net inversion delay output signal and produce the first clock signal; and control means responsive to a control signal from a source external to the integrated circuit and operable to cause the integrated circuit to operate in one of:

a) a first mode of operation during which the integrated circuit operates in response to the first clock signal and produces a first output signal at an output terminal of the integrated circuit; and b) a second mode of operation during which the first clock signal is provided at the output terminal of the integrated circuit.

2. The integrated circuit of claim 1, wherein said oscillator comprises a ring oscillator and the first clock signal corresponds to an output of the ring oscillator.

3. The integrated circuit of claim 2, wherein said control means comprises:

a plurality of multiplexers operable to receive the control signal.

4. The integrated circuit of claim 1, further comprising an input terminal for coupling a second clock signal to said oscillator from a source external to the integrated circuit; and wherein circuitry internal to the integrated circuit operates in response to the second clock signal during the second mode of operation.

5. The integrated circuit of claim 4, wherein the integrated circuit has a third mode of operation during which the oscillator is responsive to the second clock signal for providing an output signal at the output terminal determining a delay associated with the oscillator; and said control means is responsive to the control signal from the source external to the integrated circuit for causing the integrated circuit to operate in one of said first mode, said second mode, and said third mode.

6. The integrated circuit of claim 1, wherein said oscillator comprises:

a ring oscillator for producing a first signal at a first frequency; and a frequency divider responsive to the first signal at the first frequency for producing a second signal at a second frequency that is less than the first frequency;

wherein during the first mode of operation internal circuits of the integrated circuit operate in response to the second signal at the second frequency; and wherein during a third mode of operation the first signal at the first frequency is provided to the output terminal of the integrated circuit.

7. An integrated circuit comprising:

an oscillator operable to generate a first clock signal at a first frequency having a net inversion delay output signal and a frequency divider responsive to the net inversion delay output signal and control means in communication with said oscillator and input pins of the integrated circuit, and responsive to a control signal applied to at least one of the input pins of the integrated circuit from a source external to the integrated circuit to cause the integrated circuit to operate in one of:

a) a first mode of operation during which the oscillator is enabled for generating the first clock signal, and the first clock signal is provided only to circuitry internal to the integrated circuit, and the integrated circuit operates in response to the first clock signal for producing a first output signal at an output terminal of the integrated circuit; and b) a second mode of operation during which the oscillator is enabled for generating the first clock signal and the first clock signal is provided at the output terminal of the integrated circuit.

8. The integrated circuit of claim 7, wherein said oscillator comprises:

a ring oscillator comprised of a plurality of digital buffers; and a multiplexer having first and second inputs selectable for providing an output of the multiplexer, wherein a first input receives the first clock signal to form a closed loop, and a second input receives an internally generated signal.

9. The integrated circuit of claim 8, wherein said frequency divider produces a second signal at a second frequency that is less than the first frequency; and wherein during the first mode of operation the internal circuits operate in response to the second signal at the second frequency.

10. The integrated circuit of claim 7, further comprising an input terminal operable to couple a second clock signal to the oscillator from a second source external to the integrated circuit; and wherein the circuitry internal to the integrated circuit operates in response to the second clock signal during the second mode of operation.

11. The integrated circuit of claim 10, wherein the integrated circuit has a third mode of operation during which the oscillator is responsive to the second clock signal for providing an output signal at the output terminal of the integrated circuit for determining a delay associated with the oscillator.

12. The integrated circuit of claim 8, wherein the ring oscillator provides a net inversion of an input signal and comprises an even plurality of digital buffers; and wherein the output of the multiplexer is inverted.

13. The integrated circuit of claim 8, wherein the ring oscillator provides a net inversion of an input signal and comprises an odd plurality of digital buffers.

14. The integrated circuit of claim 7, wherein the control means comprises a plurality of multiplexers.

15. An integrated circuit comprising:

a plurality of I/O pins;

a clock generator in communication with at least one of the plurality of I/O pins and operable to generate a first clock signal of a first frequency; and control means in communication with the clock generator and at least some of the plurality of I/O pins, the control means responsive to a control signals from a source external to the integrated circuit, the control signal causing the control means to cause the integrated circuit to operate in one of:

a) a first mode of operation during which the integrated operates in response to the first clock signal for producing a first output signal at one of the plurality of I/O pins;

b) a second mode of operation during which the first clock signal is provided at an output pin of the plurality of I/O pins;

c) a third mode of operation during which the first clock signal is provided at the output pin of the plurality of I/O pins and wherein circuitry internal to the integrated circuit operates in response to a second clock signal provided to the integrated circuit from a source external to the integrated circuit via one of the plurality of I/O pins; and d) a fourth mode of operation during which the clock generator is responsive to the second clock signal for providing an output signal at an output pin of the plurality of I/O pins for determining a delay associated with the clock generator.

16. The integrated circuit of claim 15, wherein the clock generator comprises an oscillator; and the control means comprises a plurality of control multiplexers.

17. The integrated circuit of claim 16, wherein the oscillator comprises:

a ring oscillator comprised of a plurality of digital buffers; and a control multiplexer having first and second inputs selectable for providing an output of the control multiplexer, wherein a first input receives the first clock signal to form a closed loop, and a second input receives an internally generated signal.

18. The integrated circuit of claim 17, wherein said ring oscillator further comprises:

a frequency divider responsive to the first clock signal at the first frequency for producing a second signal at a second frequency that is less than the first frequency; and wherein during the first mode of operation the internal circuits operate in response to the second signal at the second frequency.

19. The integrated circuit of claim 18, wherein the ring oscillator provides a net inversion of an input signal applied thereto and comprises an even plurality of digital buffers; and wherein the output of the control multiplexer is inverted.

20. The integrated circuit of claim 18, wherein the ring oscillator provides a net inversion of an input signal applied thereto and comprises an odd plurality of digital buffers.

* * * * *